(12) United States Patent
Siebens

(10) Patent No.: US 10,845,392 B2
(45) Date of Patent: Nov. 24, 2020

(54) ELECTRICAL CONNECTOR HAVING A SACRIFICIAL CAP AND INTEGRATED TEST POINT

(71) Applicant: ABB Schweiz AG, Baden (CH)

(72) Inventor: Larry N. Siebens, Asbury, NJ (US)

(73) Assignee: ABB Schweiz AG, Baden (CH)

( * ) Notice: Subject to any disclaimer, the term of this patent is extended or adjusted under 35 U.S.C. 154(b) by 220 days.

(21) Appl. No.: 15/971,820

(22) Filed: May 4, 2018

(65) Prior Publication Data

US 2019/0107563 A1  Apr. 11, 2019

Related U.S. Application Data

(63) Continuation of application No. PCT/US2016/061133, filed on Nov. 9, 2016.

(60) Provisional application No. 62/252,887, filed on Nov. 9, 2015.

(51) Int. Cl.
| | |
|---|---|
| *H01R 13/53* | (2006.01) |
| *G01R 15/16* | (2006.01) |
| *H02G 15/103* | (2006.01) |
| *H02G 15/16* | (2006.01) |
| *H01R 4/22* | (2006.01) |
| *H01R 13/52* | (2006.01) |
| *G01R 1/04* | (2006.01) |

(52) U.S. Cl.
CPC .............. *G01R 15/16* (2013.01); *H01R 13/53* (2013.01); *H02G 15/103* (2013.01); *H02G 15/16* (2013.01); *G01R 1/0416* (2013.01); *H01R 4/22* (2013.01); *H01R 13/5213* (2013.01); *H01R 2201/20* (2013.01)

(58) Field of Classification Search
CPC ...... H01R 13/53; H01R 13/5213; H01R 4/22; G01R 1/0416; G01R 15/16
See application file for complete search history.

(56) References Cited

U.S. PATENT DOCUMENTS

| 3,980,374 A | 9/1976 | Fallot |
|---|---|---|
| 8,172,596 B2 * | 5/2012 | Siebens .................. B23P 17/00 |
| | | 439/301 |

(Continued)

OTHER PUBLICATIONS

International Search Report and Written Opinion issued in corresponding international application No. PCT/US2016/061133, dated Jan. 6, 2017, 10 pp.

*Primary Examiner* — Tho D Ta

(74) *Attorney, Agent, or Firm* — Taft Stettinius & Hollister LLP; J. Bruce Schelkopf

(57) ABSTRACT

A medium or high voltage electrical device includes a housing, a central conductor provided within the housing, and a sacrificial cap configured for mounting on the housing. The sacrificial cap includes an outer housing, an insulated body, and a sacrificial conductor provided within the insulated body, wherein the sacrificial conductor electrically communicates with the central conductor within the housing when the sacrificial cap is mounted on the housing. A voltage test point terminal is provided within the insulated body and accessible via the outer housing of the sacrificial cap to capacitively couple with the sacrificial conductor. The sacrificial cap includes a portion configured to be physically severed to confirm that the electrical connector is de-energized.

20 Claims, 9 Drawing Sheets

(56) References Cited

U.S. PATENT DOCUMENTS

| | | | |
|---|---|---|---|
| 8,597,040 B2* | 12/2013 | Siebens | G01R 1/0416 439/301 |
| 9,472,868 B2* | 10/2016 | Siebens | H01R 4/646 |
| 2007/0089896 A1 | 4/2007 | Stepniak et al. | |
| 2007/0141882 A1 | 6/2007 | Stepniak | |
| 2011/0025342 A1* | 2/2011 | Siebens | G01R 15/165 324/538 |
| 2011/0217876 A1 | 9/2011 | Siebens | |
| 2013/0122740 A1 | 5/2013 | Siebens | |
| 2014/0024268 A1* | 1/2014 | Mikli | H01R 24/20 439/700 |
| 2015/0118892 A1 | 4/2015 | Siebens et al. | |

* cited by examiner

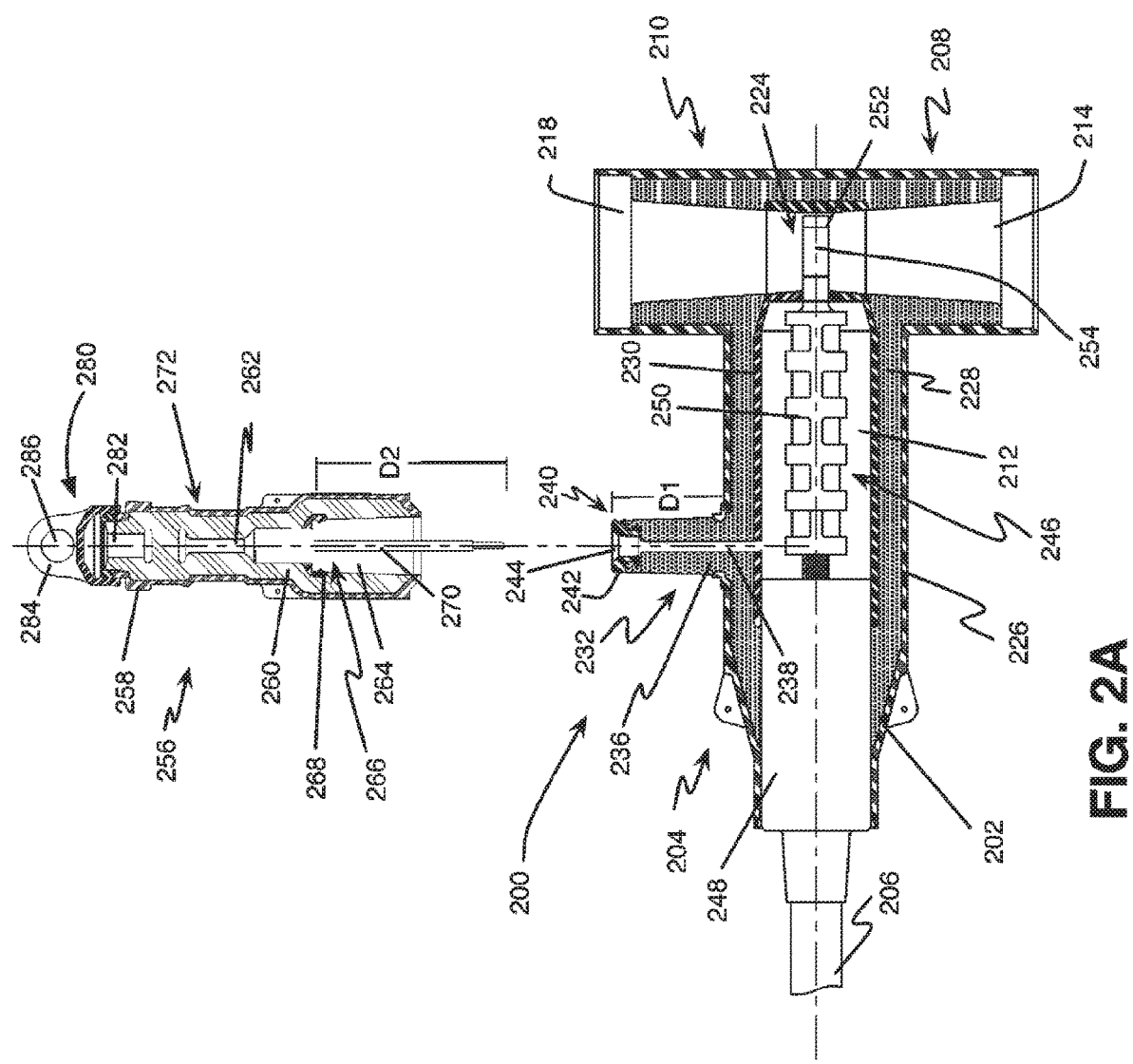

US 10,845,392 B2

ELECTRICAL CONNECTOR HAVING A SACRIFICIAL CAP AND INTEGRATED TEST POINT

BACKGROUND

The present application generally relates to electrical cable connectors, such as splicing connectors for joining two or more electrical cables, loadbreak connectors, and deadbreak connectors. More particularly, aspects described herein relate to an electrical cable connector that includes a feature for enabling personnel to ensure that the connector is de-energized.

High and medium voltage electrical connectors and components typically operate in the 15 to 35 kilovolt (kV) range. Because such voltages are potentially very dangerous, it is typically necessary for personnel to confirm that the power is disconnected before commencing work or repair. Known methods of visual or physical de-energizing confirmation include "spiking the cable," in which a grounded spike is driven thru the cable and into the conductor or a grounded hydraulic cable cutter is used to physically cut the cable in half.

Unfortunately, after a cable is "spiked," the utility is required to replace the cable or increase its length by adding a splice and additional cable in order to reconnect to the system. This is costly and time consuming.

BRIEF SUMMARY

An aspect of an embodiment of the present application is a medium or high voltage electrical device having a housing, a central conductor provided within the housing, and a sacrificial cap configured for mounting on the housing. The sacrificial cap can comprise an outer housing, an insulated body, and a sacrificial conductor provided within the insulated body, wherein the sacrificial conductor electrically communicates with the central conductor within the housing when the sacrificial cap is mounted on the housing. The electrical device can also include a voltage test point terminal that is provided within the insulated body and accessible via the outer housing of the sacrificial cap to capacitively couple with the sacrificial conductor. Further, the sacrificial cap can include a portion that is configured to be physically severed to confirm that the electrical connector is de-energized.

Another aspect of an embodiment of the present application is a method that includes providing an electrical device with a housing and a central conductor provided within the housing and installing a sacrificial cap onto the electrical device so that a sacrificial conductor of the sacrificial cap electrically communicates with the central conductor of the electrical device. The sacrificial cap can include a voltage test point terminal that capacitively couples with the sacrificial conductor. Further, a voltage at the voltage test point terminal in the sacrificial cap can be monitored, and, when it is determined that the sacrificial cap is de-energized based on the monitoring, the sacrificial cap can be physically severed to confirm that the electrical device is de-energized. Additionally, service can be performed on equipment conductively coupled to the electrical device, and the sacrificial cap can be removed and a replacement sacrificial cap can be installed onto the electrical device.

BRIEF DESCRIPTION OF THE DRAWINGS

The description herein makes reference to the accompanying figures wherein like reference numerals refer to like parts throughout the several views.

FIG. 2A is an exploded, schematic, cross-sectional diagram illustrating a power cable elbow connector consistent with implementations described herein.

FIG. 2B is a side view of the sacrificial cap depicted in FIG. 2A.

Figure 1A:
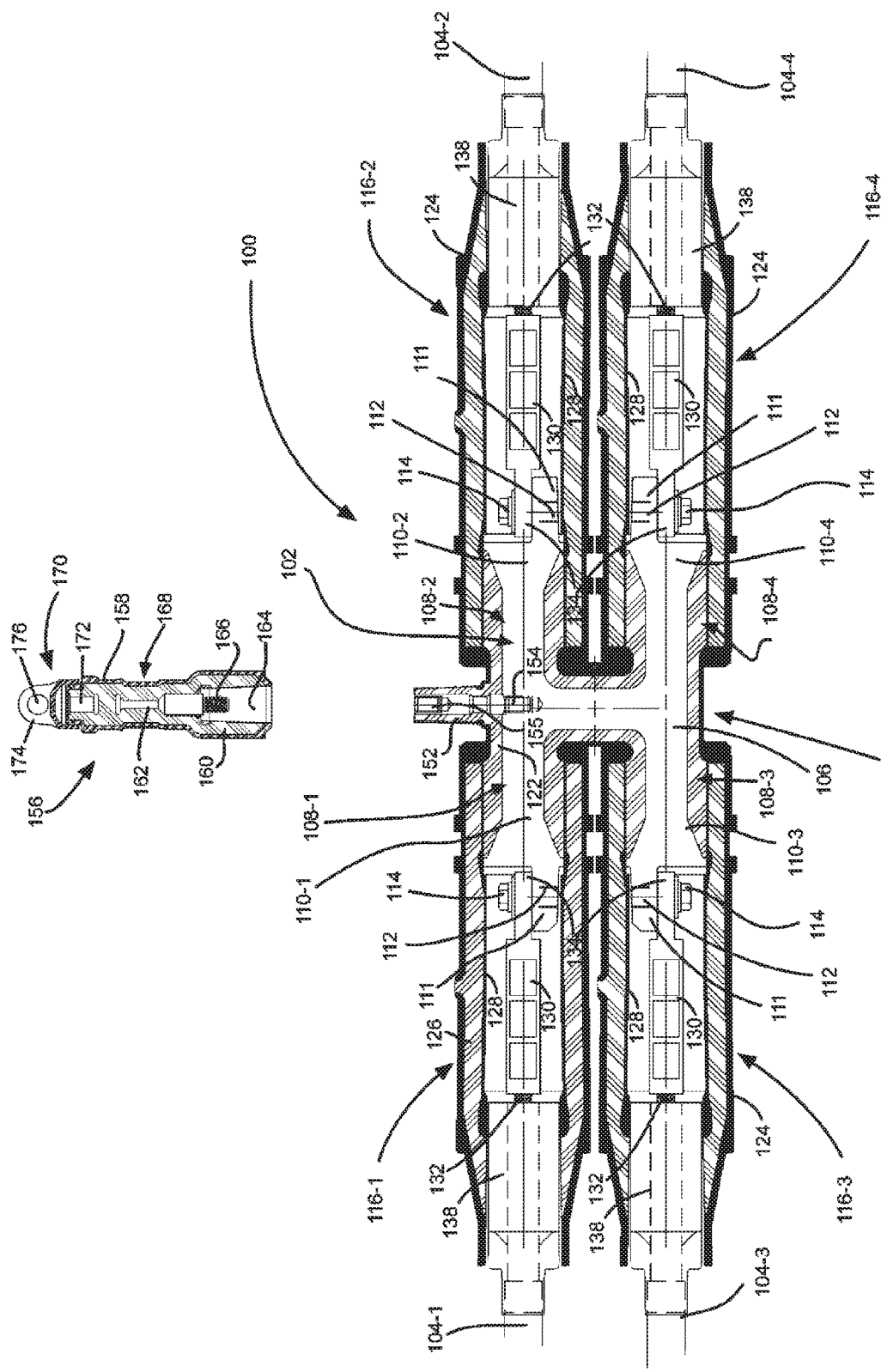
FIGS. 1A and 1B are schematic cross-sectional diagrams illustrating a power cable splicing connector consistent with implementations described herein.

The foregoing summary, as well as the following detailed description of certain embodiments of the present application, will be better understood when read in conjunction with the appended drawings. For the purpose of illustrating the application, there is shown in the drawings, certain embodiments. It should be understood, however, that the present application is not limited to the arrangements and instrumentalities shown in the attached drawings. Further, like numbers in the respective figures indicate like or comparable parts.

DESCRIPTION OF THE ILLUSTRATED EMBODIMENTS

The following detailed description refers to the accompanying drawings. Certain terminology is used in the foregoing description for convenience and is not intended to be limiting. Words such as "upper," "lower," "top," "bottom," "first," and "second" designate directions in the drawings to which reference is made. This terminology includes the words specifically noted above, derivatives thereof, and words of similar import. Additionally, the words "a" and "one" are defined as including one or more of the referenced item unless specifically noted. The phrase "at least one of" followed by a list of two or more items, such as "A, B or C," means any individual one of A, B or C, as well as any combination thereof. The same reference numbers in different drawings may identify the same or similar elements.

FIG. 1A is a schematic cross-sectional diagram illustrating a power cable splicing connector 100 configured in a manner consistent with implementations described herein. As shown in FIG. 1, the power cable splicing connector 100 can include a four-way yoke 102 for enabling connection of power cables 104-1, 104-2, 104-3, and 104-4 (collectively "power cables 104," and individually "power cable 104-*x*"). For example, power cable 104-1 can be a supply cable and cables 104-2 to 104-4 can be load cables. Other types of power cable splicing connectors can be configured in accordance with implementations described herein, such as, for example, three-way yoke connectors or two-way connectors, among other connectors.

In one implementation, yoke 102 of the power cable splicing connector 100 can include a central conductor 106 and number of splice openings 108-1 to 108-4 (collectively "splice openings 108," and individually "splice opening 108-*x*"). The central conductor 106 can be formed of a suitably conductive material, such as copper, aluminum, or other conductive alloy. Further, as shown in FIG. 1, the central conductor 106 can include outwardly extending portions 110-1 to 110-4 (collectively "outwardly extending portion 110," and individually "outwardly extending portion 110-*x*") that project from respective splice openings 108-*x*. As described in additional detail below, the central conductor 106 can connect each of power cables 104-*x* to each other power cable 104-*x*, such that voltage applied to one cable is transferred to each other cable.

The outwardly extending portions 110 can be configured to receive connector portions of power cables 104. For example, each extending portion 110-*x* can include a spade portion 111 having a threaded bore 112 therein for receiving a connector bolt 114. In one configuration, as illustrated in FIG. 1, the outwardly extending portion 110-4 extends oppositely from the outwardly extending portion 110-2 and the outwardly extending portion 110-3 extends oppositely from the outwardly extending portion 110-4. Furthermore, the outwardly extending portions 110-1, 110-2 can be oriented parallel to the outwardly extending portions 110-3, 110-4, respectively. Such a configuration can provide for compact splicing or splitting of a power supply cable (e.g., cable 104-1) to multiple load cables (e.g., cables 104-2 to 104-4).

As shown in FIG. 1A, each splice opening 108-*x* includes a cable receptacle interface that includes a substantially cylindrical flange or cuff portion that is configured to frictionally engage a cable receptacle 116-*x* (individually, cable receptacle 116-*x*, or collectively, cable receptacles 116). For example, an inside diameter of a forward end of the cable receptacle 116-*x* can be sized to frictionally engage the cuff portion of splice opening 108-*x*. Each cable receptacle 116 be substantially cylindrical and can be configured to surround and protect an interface between the power cables 104 and the extending portions 110.

The yoke 102 can include an outer shield 120 formed from, for example, a peroxide-cured synthetic rubber, commonly referred to as EPDM (ethylene-propylene-dienemonomer). Within the shield 120, the yoke 102 can include an insulative inner housing 122, typically molded from an insulative rubber or epoxy material. The central conductor 106 can be enclosed within the insulative inner housing 122.

Regarding the cable receptacles 116, each cable receptacle 116-*x* can include an EPDM outer shield 124 and an insulative inner housing 126, typically molded from an insulative rubber or epoxy material. The cable receptacle 116-*x* can further include a conductive or semi-conductive insert 128 having a bore therethrough. Upon assembly, the cable receptacle 116 can surround the interface between the power cable 104-*x* and the extending portion 110-*x*. In one implementation, a forward end of the insert 128 can be configured to frictionally engage the outwardly extending portion 110-*x* of the central conductor 106 upon assembly of the splicing connector 100, thereby ensuring the electrical integrity of the splicing connector 100.

Referring to the power cables 104, a forward end of each power cable 104-*x* can be prepared by connecting the power cable 104 to a crimp connector 130. The crimp connector 130 can include a substantially cylindrical assembly that is configured to receive a cable conductor 132 of the power cable 104-*x* therein. During preparing of the power cable 104-*x*, a portion of the crimp connector 130 can be physically deformed (e.g., crimped) to the fasten crimp connector 130 to the cable conductor 132. The crimp connector portion 130 can include a forward spade portion 134 that is configured to be securely fastened to a spade portion 111 of the outwardly extending portion 110-*x* of the central conductor 106. For example, the forward spade portion 134 can include a bore (not shown) that is configured to align with the bore 112 in the spade portion 111. The connector bolt 114 can be inserted through the bore and into the threaded bore 112 during, assembly of the splice connector 100.

As shown in FIG. 1A, each of the prepared power cables 104 can further include an adapter 138 disposed rearwardly relative to crimp connector 130. Adapter 138 can be affixed to power cable 104-*x* and can provide a frictional engagement with a rearward portion of cable receptacle 116-*x*. In one implementation, adapter 138 can be formed of an insulative material, such as rubber or epoxy.

Consistent with embodiments described herein, the yoke 102 can include a sacrificial appendage connection portion 152 projecting outwardly therefrom, as shown in FIG. 1A. In one implementation, the sacrificial appendage connection portion 152 can be integrally formed with the inner housing 122 and can include a contact 154 provided therein. The contact 154 can extend into a corresponding portion of the central conductor 106, such as via a threaded bore provided in the central conductor 106. The contact 154 can include a female thread 155 at an outer end thereof for receiving a sacrificial cap 156.

Figure 1B:
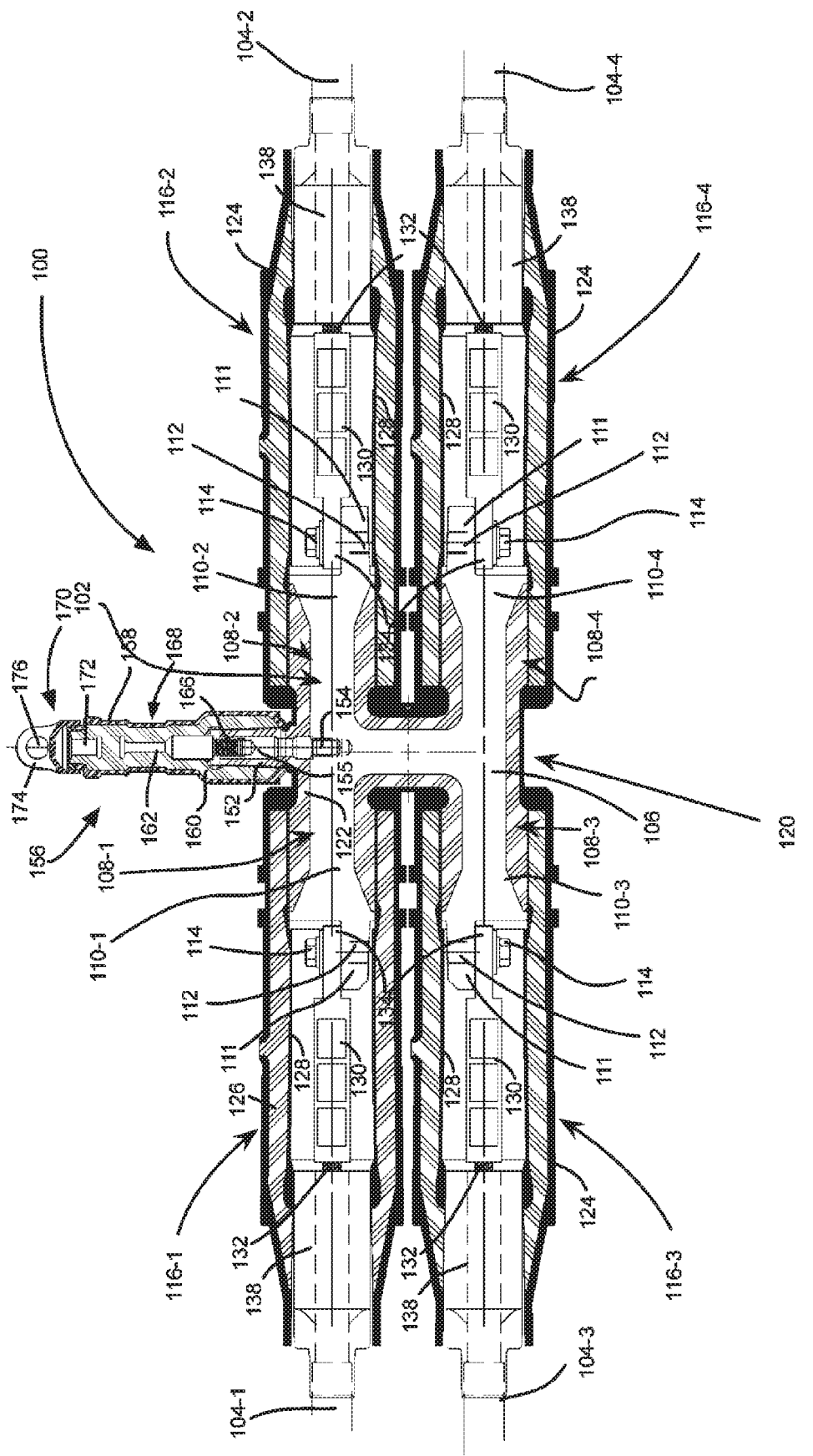
Figure 1D:
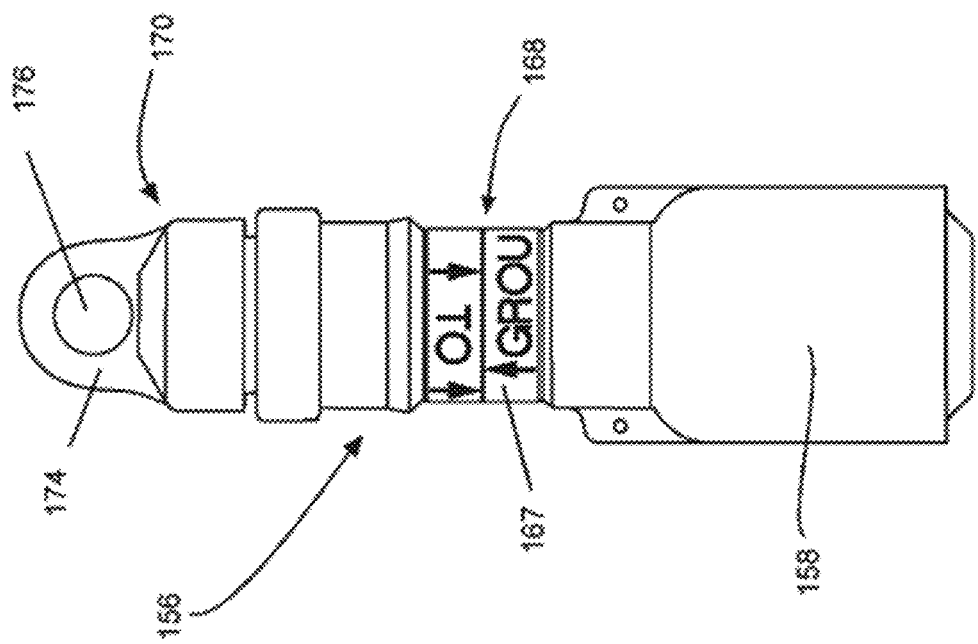
FIGS. 1C and 1D are cross-sectional and side view diagrams of the sacrificial cap depicted in FIGS. 1A and 1B.
Figure 1C:
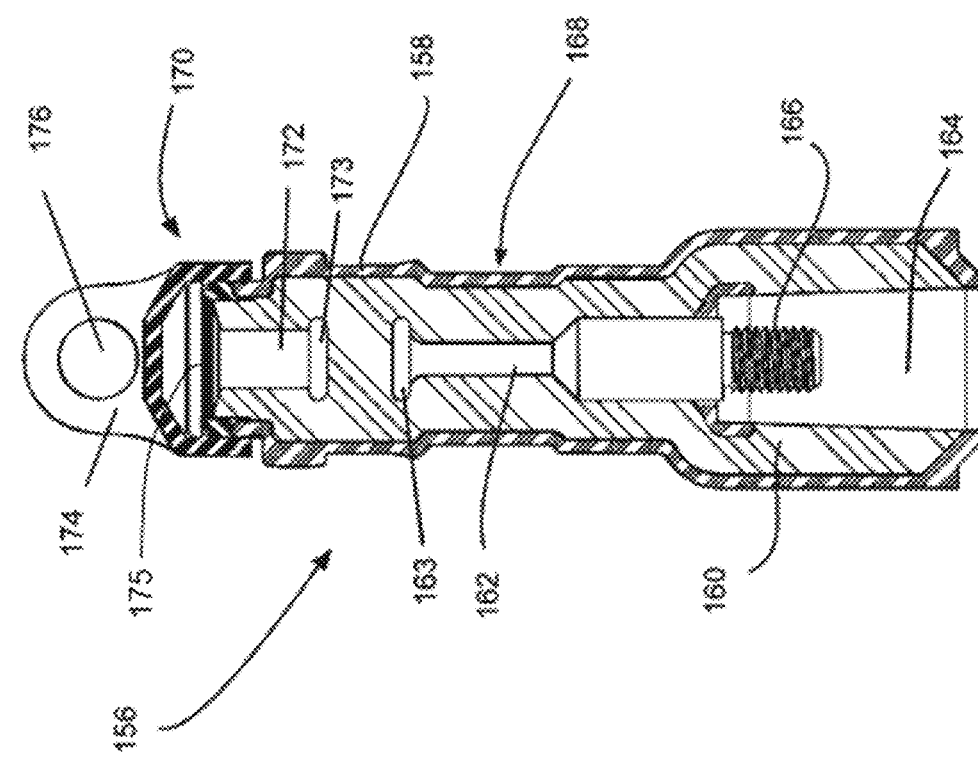

FIGS. 1C and 1D illustrate a cross-sectional view and a side view, respectively, of an illustrated embodiment of the sacrificial cap 156. As shown in FIGS. 1A and 1B, the sacrificial cap 156 can include an EPDM outer shield 158 and an insulative inner housing 160, which can, according to certain embodiments, typically be molded from an insulative rubber or epoxy material. The sacrificial cap 156 can further include a sacrificial conductor 162 received within a rearward portion of the inner housing 160. Furthermore, a forward portion of the sacrificial cap 156 can include a cavity 164 therein shown in FIG. 1C) for engaging a projecting portion of the sacrificial appendage connection portion 152.

A forward portion of the outer shield 158 and the inner housing 160 can be configured to surround and protect an interface between the sacrificial appendage connection portion 152 and the sacrificial conductor 162. In one implementation, a forward end of the outer shield 158 and the inner housing 160 can be configured to frictionally engage a stepped or notched outer configuration of the sacrificial appendage connection portion 152 upon assembly of the splicing connector 100, thereby ensuring the electrical integrity of the splicing connector 100.

Consistent with implementations described herein, the sacrificial conductor 162 can include a conductive threaded mate protrusion 166 extending axially therefrom. As described above, the projecting portion of contact 154 can include the threaded female cavity 155. The male protrusion 166 can correspond to the threaded female portion 155 in the contact 154 to couple the contact 154 to the sacrificial conductor 162, thereby conductively connecting the sacrificial conductor 162 to the central conductor 106 of yoke 102. In other implementations, the mate/female relationship can be reversed.

In some embodiments, a portion 163 of the sacrificial conductor 162 opposite from the male protrusion 166 can be formed to include a diameter greater than the remaining diameter of the sacrificial conductor 162. As described below, portion 163 can be configured to capacitively interface with a corresponding portion 173 of a voltage detection test point assembly.

In one implementation, a cut-through region 168 can be provided in an outer portion of the sacrificial cap 156 in a region overlying at least a portion of the sacrificial conductor 162. In some implementations, indicia 167 relating to the cut-through region 168 can be provided on a surface of the outer housing 158 for indicating that a user is to cut through the sacrificial cap 156 at the cut-through region 168.

Further consistent with embodiments described herein, the sacrificial cap 156 can include an integrated voltage detection test point assembly 170 for enabling sensing of a voltage in the sacrificial conductor 162. The voltage detection test point assembly 170 can be configured to allow an external voltage detection device to detect and/or measure a voltage associated with the splicing connector 100 when the sacrificial cap 156 is installed on the sacrificial appendage connection portion 152.

For example, as illustrated in FIG. 1C, the voltage detection test point assembly 170 can include a test point terminal 172 embedded in a portion of the inner housing 160 of the sacrificial cap 156 and extending through an opening 175 within sacrificial cap outer shield 158. In one exemplary embodiment, the test point terminal 172 can be formed of a conductive metal or other conductive material. In this manner, the test point terminal 172 can be capacitively coupled to the electrical conductor elements (e.g., sacrificial conductor 162) within the sacrificial cap 156. As described above, portion 173 of the test point terminal 172 can be enlarged (e.g., have a greater diameter than) relative to a remainder of the test point terminal 172 to provide an increased surface area for the capacitively engaging portion 163 of sacrificial conductor 162.

Consistent with implementations described herein, a test point cap 174 can seal the test point terminal 172 to the sacrificial cap outer shield 158 when the voltage test point assembly 170 is not being tested. In one implementation, the test point cap 174 can be formed of a semi-conductive material, such as EPDM compounded with conductive additives. When the test point terminal 172 is not being accessed, the test point cap 174 can be mounted on the test point assembly 170 or to a portion of the sacrificial cap outer shield 158 adjacent the test point terminal 172. Because the test point cap 174 is formed of a conductive or semi-conductive material, the test point cap 174 can ground the test point when in position. The test point cap 174 can include an aperture 176 for facilitating removal of the test point cap 174 in the field, e.g., using a hooked lineman's tool.

When work is to be performed on any of power cables 104 (or devices connected to power cables 104), a worker can remove the test point cap 174, monitor voltage via the test point terminal 172, and cut through the sacrificial cap 156 at the cut-through region 168 (e.g., with a grounded hydraulic cable cutter, or similar tool) to ensure that electrical the system that the splicing connector 100 is connected to has been properly de-energized and is, therefore, safe to work on. When it is time to reenergize the splicing connector 100, the cut-through sacrificial cap 156 can be removed and a new or replacement sacrificial cap 156 can be installed.

FIG. 2A is an unassembled or exploded, schematic, cross-sectional diagram illustrating a power cable elbow connector 200 consistent with implementations described herein. As shown, the power cable elbow connector 200 can include a main housing body 202 that includes a conductor receiving end 204 for receiving a power cable 206 therein and first and second T-ends 208/210.

The conductor receiving end 204 can extend along a main axis of the connector 200 and can include a bore 212 extending therethrough. The first and second T-ends 208/210 can project substantially perpendicularly from the conductor receiving end 204 in opposing directions from one another. For example, the first T-end 208 can be downwardly positioned and include a bore 214 therein for receiving an equipment bushing, such as, for example, a deadbreak or loadbreak transforming bushing or other high or medium voltage terminal. The second T-end 210 can be upwardly positioned and can include a bore 218 therein, and can be configured to receive an equipment fitting, such as, for example, an insulating plug, a grounding plug, or another elbow connector. A contact area 224 can be formed at the confluence of the bores 212, 214, and 218.

The power cable elbow connector 200 can include an electrically conductive outer shield 226 formed from, for example, EPDM. Within the shield 226, the power cable elbow connector 200 can include an insulative inner housing 228 that can, for example, typically be molded from an insulative rubber or epoxy material. Within the insulative inner housing 228, the power cable elbow connector 200 can include a conductive or semi-conductive insert 230 that surrounds the connection portion of the power cable 206.

Consistent with embodiments described herein, the power cable elbow connector 200 can include a direct access interface port 232 that can provide a direct port to a conductor of the power cable 206 and the bore 212 in the conductor receiving end 204. As described below, the direct access interface port 232 can be configured to allow an external sacrificial component to directly engage and interface with a conductor of power cable 206.

For example, as illustrated in FIG. 2A, the direct access port 232 can include a projection region 236 that projects substantially perpendicularly from the main axis of the conductor receiving end 204 in a region that overlies at least a portion of the power cable 206. As shown, the projection region 236 can be formed integral with the insulative inner housing 228 and can extend through an opening within the outer shield 226. In some implementations, the projection region 236 can be frustoconically shaped to provide for a frictional engagement with an attached accessory, as described below. In other implementations, the projection region 236 can be substantially cylindrical.

As shown in FIG. 2A, the projection region 236 can include a bore 238 therethrough that communicates with the bore 212 in the conductor receiving end 204. The inner insert 230 can include an opening that corresponds with the bore 212 to provide access to the bore 212. As described below, the bore 238 can allow a contact probe to extend into the bore 212 and come into contact with a conductor of the power cable 206.

An upper surface of projection region 236 can include a ribbed engagement area 240. The ribbed engagement area 240 can provide an interface for frictionally securing an accessory attachment to the direct access portion 232. For example, the ribbed engagement area 240 can be formed of a resilient material, such as a rubber or polymer, and can include an annular groove (or grooves) 242 formed therein. A corresponding rib (or ribs) in an engagement portion of the accessory to be attached can matingly engage the groove 242 to secure the accessory to the port 232.

As shown, the ribbed engagement area 240 can include an opening 244 therethrough that corresponds with the bore 238 in projection region 236. In some embodiments, the opening 244 can have a larger diameter than the bore 238 and can include one or more tapered portions for facilitating insertion of a contact probe into the bore 238.

As shown in FIG. 2A, the projection region 236 can extend a distance D1 from an adjacent outer surface of the conductor receiving end 204 to provide sufficient isolation between the semi-conductive outer shield 226 and the opening 244 when the opening 244 is uncovered (e.g., when no cap or accessory is mounted to direct access port 232). An exemplary distance D1 can be in the range of 1.25 to 2.5 inches.

The conductor receiving end 204 of the power cable elbow connector 200 can be configured to receive a prepared end of the power cable 206 therein. For example, a forward end of the power cable 206 can be prepared by connecting the power cable 206 to a conductor spade assembly 246. More specifically, the conductor spade assembly 246 can include a rearward sealing portion 248, a crimp connector portion 250, and a spade portion 252.

The rearward sealing portion 248 can include an insulative material surrounding a portion of the power cable 206 about an opening of the conductor receiving end 204. When the conductor spade assembly 246 is positioned within the connector body 202, the rearward sealing portion 248 can seal an opening of the conductor receiving end 204 about the power cable 206.

The crimp connector portion 250 can include a substantially cylindrical conductive assembly that is configured to receive a center conductor (not shown) of the power cable 206 therein. The crimp connector portion 250 can be crimped onto the center conductor prior to insertion of the cable 206 into the conductor receiving end 204.

The spade portion 252 can be conductively coupled to the crimp connector portion 250 and can extend axially therefrom within the bore 212. For example, in some implementations, the spade portion 252 can be formed integrally with the crimp connector portion 250 and be made of a conductive metal, such as steel, brass, aluminum, etc. As shown in FIG. 2A, the spade portion 252 can include a bore 254 extending perpendicularly therethrough. Upon insertion of the prepared cable 206 into the power cable elbow connector 200, the spade portion 252 can extend into the contact area 224, with the bore 254 aligned with the bores 214, 218 in the first and second T-ends 208/210, respectively. Once the spade portion 252 is seated within the contact area 224, the bore 254 can allow a threaded stud or other coupling element (e.g., a pin, rod, bolt, etc.) to conductively couple the spade portion 254 to bushings or other equipment positioned within the first and second T-ends 208/210.

Figure 2C:
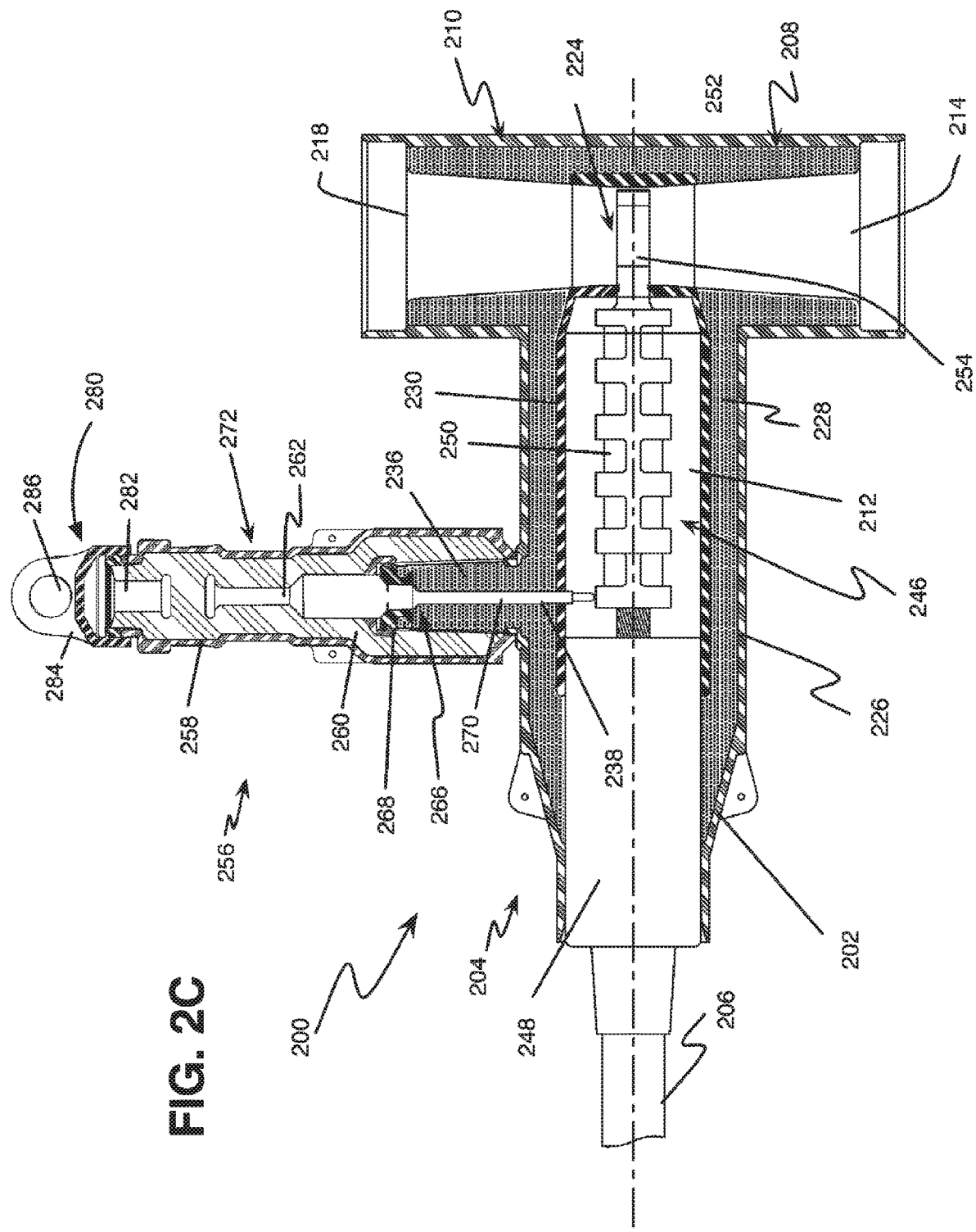
FIG. 2C is a schematic cross-sectional diagram illustrating the power cable elbow connector depicted in FIG. 2A in an assembled configuration.

Consistent with implementations described herein, a sacrificial probe assembly 256 can be mounted to the power cable elbow connector 200 via the direct access port 232. FIG. 2B is a side view of an illustrative embodiment of the sacrificial probe assembly 256. FIG. 2C is a cross-sectional diagram illustrating the depicted embodiment of the power cable elbow connector 200 in an assembled configuration in which the sacrificial probe assembly 256 is mounted to the direct access port 232.

As shown in FIG. 2A, the sacrificial probe assembly 256 can include an EPDM outer shield 258 and an insulative inner housing 260 that can, according to certain embodiments, typically be molded from an insulative rubber or epoxy material. The sacrificial probe assembly 256 can also include a sacrificial conductor 262 embedded within a portion of the housing 260. The sacrificial probe assembly 256 can include a generally cylindrical or frustoconical cavity 264 therein for receiving the projection region 236 of the direct access port 232.

As shown in FIG. 2A, the cavity 264 can include an engagement portion 266 formed therein for engaging the corresponding ribbed engagement area 240 of the direct access port 232. For example, according to certain embodiments, the engagement portion 266 can include one or more resilient annular ribs or rings 268 that can engage the groove(s) 242 in the ribbed engagement area 240 during mounting of the sacrificial probe assembly 256 to the power cable elbow connector 200.

Consistent with implementations described herein, the sacrificial probe assembly 256 can include a contact probe 270 conductively coupled to the sacrificial conductor 262 and the projecting through cavity 264. In some implementations, the contact probe 270 can be integrally formed with the sacrificial conductor 262. As shown in FIG. 2A, the contact probe 270 can extend a distance D2 beyond a lower surface of the sacrificial conductor 262. Distance D2 can correspond to a distance between the engagement area 240 in the direct access port 232 and an outer surface of the power cable 206 (e.g., an outer surface of the crimp connector portion 250) thus allowing the contact probe 270 of the installed sacrificial probe assembly 256 to conductively engage a portion of the power cable 206. In some embodiments, the contact probe 270 can be resiliently connected to the sacrificial conductor 262, such as via a conductive spring, etc., thus allowing varying sizes or diameters of the power cables 206 to be used with a particular sacrificial probe assembly 256.

In one implementation, a cut-through region 272 can be provided in a portion of the sacrificial probe assembly 256 in a region overlying at least a portion of the sacrificial conductor 262. In some implementations, indicia 274 relating to cut-through region 272 can be provided on a surface of the outer shield 258, as shown in FIG. 2B, for indicating that a user is to cut through the sacrificial probe assembly 256 at the cut-through region 272.

Further consistent with embodiments described herein, the sacrificial probe assembly 256 includes an integrated voltage detection test point assembly 280 for enabling sensing of a voltage in the sacrificial conductor 262. The voltage detection test point assembly 280 can be configured to allow an external voltage detection device to detect and/or measure a voltage associated with the power cable connector 200 when the sacrificial probe assembly 256 is installed on the projection region 236 of the direct access port 232.

For example, as illustrated in FIG. 2A, voltage detection test point assembly 280 can include a test point terminal 282 embedded in a portion of the inner housing 260 of the sacrificial probe assembly 256 and extending through an opening within the sacrificial probe assembly outer shield 258. In one exemplary embodiment, the test point terminal 282 can be formed of a conductive metal or other conductive material. In this manner, the test point terminal 282 can be capacitively coupled to the electrical conductor elements (e.g., sacrificial conductor 262) within the sacrificial probe assembly 256.

Consistent with implementations described herein, a test point cap 284 can seal the test point terminal 282 to the sacrificial probe assembly outer shield 258 when the voltage test point assembly 280 is not being tested. In one implementation, the test point cap 284 can be formed of a semi-conductive material, such as EPDM compounded with conductive additives. When the test point terminal 282 is not being accessed, the test point cap 284 can be mounted on the test point assembly 280 or to a portion of the sacrificial probe assembly outer shield 258 adjacent the test point terminal 282. Because the test point cap 284 is formed of a conductive or semi-conductive material, the test point cap 284 can ground the test point when in position. The test point cap 284 can include an aperture 286 for facilitating removal of the test point cap 284 in the field, e.g., using a hooked lineman's tool.

When work is to be performed on the power cable 206 (or devices connected to power cable 206), a worker can remove the test point cap 284, monitor voltage via the test point terminal 282, and cut through the sacrificial probe assembly 256 at the cut-through region 272 (e.g., with a grounded hydraulic cable cutter, or similar tool) to ensure that the electrical system that the connector 200 is connected to has been properly de-energized and is, therefore safe to work on. When it is time to reenergize the connector 200, the damaged (i.e., severed) sacrificial probe assembly 256 can be removed and a new or replacement sacrificial probe assembly can be installed.

Figure 3:
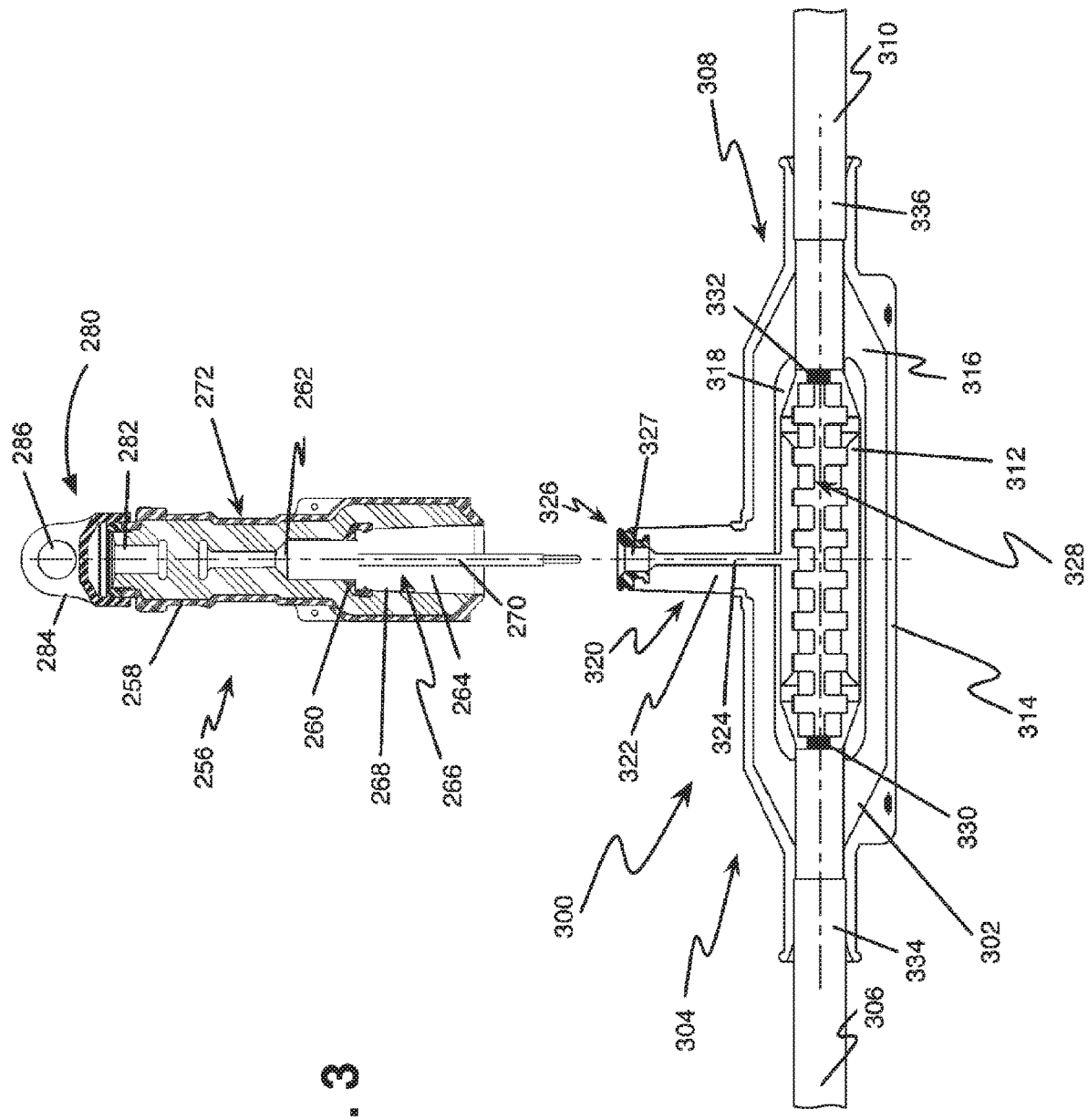
FIG. 3 is an exploded, schematic, cross-sectional diagram illustrating a power cable splice connector consistent with still another implementation described herein.

FIG. 3 is an exploded cross-sectional diagram illustrating a power cable splice connector 300 for use with sacrificial probe assembly sacrificial probe assembly 256 described above. As shown, sacrificial probe assembly power cable splice connector 300 can include a main housing body 302 that includes a first conductor receiving end 304 for receiving a first power cable 306 therein and a second conductor receiving end 308 for receiving a second power cable 310. The first and second conductor receiving ends 304/308 can extend along a main axis of the splice connector 300. In addition, the splice connector 300 can include a longitudinal bore 312 extending therethrough from the first conductor receiving end 304 to the second conductor receiving end 308.

The power cable splice connector 300 can include an electrically conductive outer shield 314 formed from, for example, EPDM. Within the shield 314, the power cable splice connector 300 can include an insulative inner housing 316, typically molded from an insulative rubber or epoxy material. Within the insulative inner housing 316, the power cable splice connector 300 can include a conductive or semi-conductive insert 318 that surrounds the connection portions of power cables 306 and 310.

Consistent with embodiments described herein, the power cable splice connector 300 can include a direct access interface port 320 that provides a direct port to a conductor of the spliced power cables 306/310 via the bore 312 in the splice connector 300. As described below, the direct access interface port 320 can be configured to allow the sacrificial probe assembly 256 to directly engage and interface with a conductor of the spliced power cables 306/310.

For example, as illustrated in FIG. 3 the direct access port 320 can include a projection region 322 that projects substantially perpendicularly from the main axis of splice connector 300 in a region that overlies at least a portion of the spliced power cables 306/310. As shown, the projection region 322 can be formed integral with the insulative inner housing 316 and can extend through an opening within the outer shield 314. In some implementations, the projection region 322 can be frustoconically or cylindrically shaped to provide for a frictional engagement with the sacrificial probe assembly 256.

As shown in FIG. 3, the projection region 322 can include a bore 324 therethrough that communicates with the bore 312 in the splice connector 300. The inner insert 318 can include an opening that corresponds with the bore 312 to provide access to the bore 312. The bore 324 in the projection region 322 can allow the contact probe 270 of the sacrificial probe assembly 256 to extend into the bore 312 and come into contact with a conductor of the spliced power cables 306/310.

Similar to the projection region 236 described above with respect to FIG. 2A-2C, an upper surface of projection region 322 can include a ribbed engagement area 326 to enable the sacrificial probe assembly 256 to be frictionally secure to the direct access portion 320. The ribbed engagement area 326 can include an opening 327 therethrough that corresponds with the bore 324 in the projection region 322.

The conductor receiving ends 304/308 of the power cable splice connector 300 can be configured to receive the power cables 306/310 therein. For example, the power cable splice connector 300 can be slid along a length of one of the power cables 306/310 prior to splicing of the cables. The power cable 306 can be spliced to the power cable 310 with a crimp connector 328 or similar connector. The crimp connector 328 can include a substantially cylindrical conductive assembly configured to receive the center conductors 330/332 of the power cables 306/310 therein. The crimp connector 328 can be crimped onto the center conductors 330/332.

The power cables 306/310 can be further prepared to include respective rearward sealing portions 334/336. The rearward sealing portions 334/336 can include an insulative material surrounding a portion of the power cables 306/310. When the crimp connector 328 is positioned within the connector body 302, the rearward sealing portions 334/336 can seal openings in the first and second conductor receiving ends 304/308 about the power cables 306/310.

Following splicing with the crimp connector 328, the power cable splice connector 300 can be slid along the cables until the splice is centrally positioned within the splice connector 300. The sacrificial probe assembly 256 can be mounted to the direct access port 320 in a manner similar to that described above with respect to FIGS. 2A-2C, thereby placing the contact probe 270 into conductive contact with the crimp connector 328.

When it is necessary for work to be performed on the power cables 306/310 (or devices connected to the power cables 306/310), a worker can cut through the sacrificial probe assembly 256 at the cut-through region 272 to ensure that the electrical system that the spice connector 300 is connected to has been properly de-energized and is, therefore, safe to work on. When it is time to reenergize the splice connector 300, the damaged (i.e., severed) sacrificial probe assembly 256 can be removed and a new or replacement sacrificial probe assembly can be installed.

Figure 4:
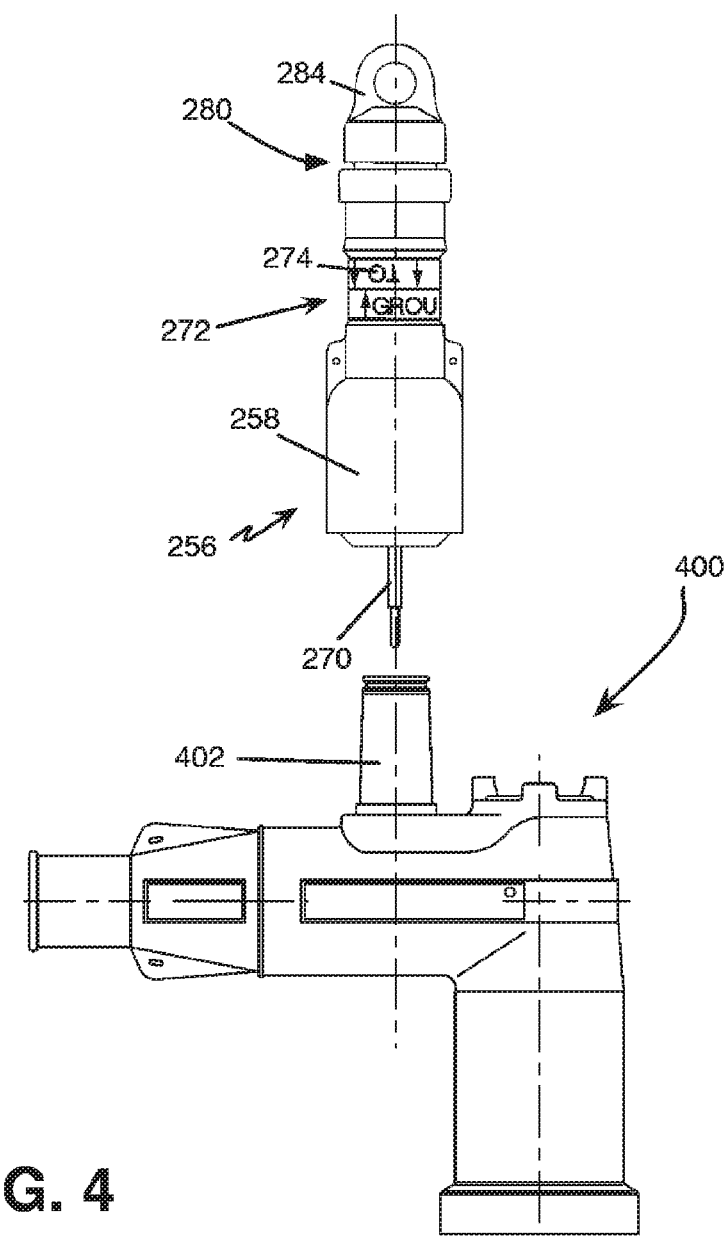
FIG. 4 is a side view illustrating another power cable elbow connector consistent with implementations described herein.

FIG. 4 is a side view of another exemplary power cable connector for use with the sacrificial probe assembly described herein. More specifically, FIG. 4 illustrates a loadbreak elbow connector 400 having a direct access port 402 formed therein. Similar to the direct access port 232 on the power cable elbow connector 200 described above, the direct access port 402 provides an access to the conductor of an installed power cable. The sacrificial probe assembly 256 can be installed on the direct access port 402 and severed at cut-through region 272 when in is necessary to ensure that the connector has been de-energized. When work has been completed, a new sacrificial probe assembly 256 can be installed on the direct access port 402.

Figure 5A:
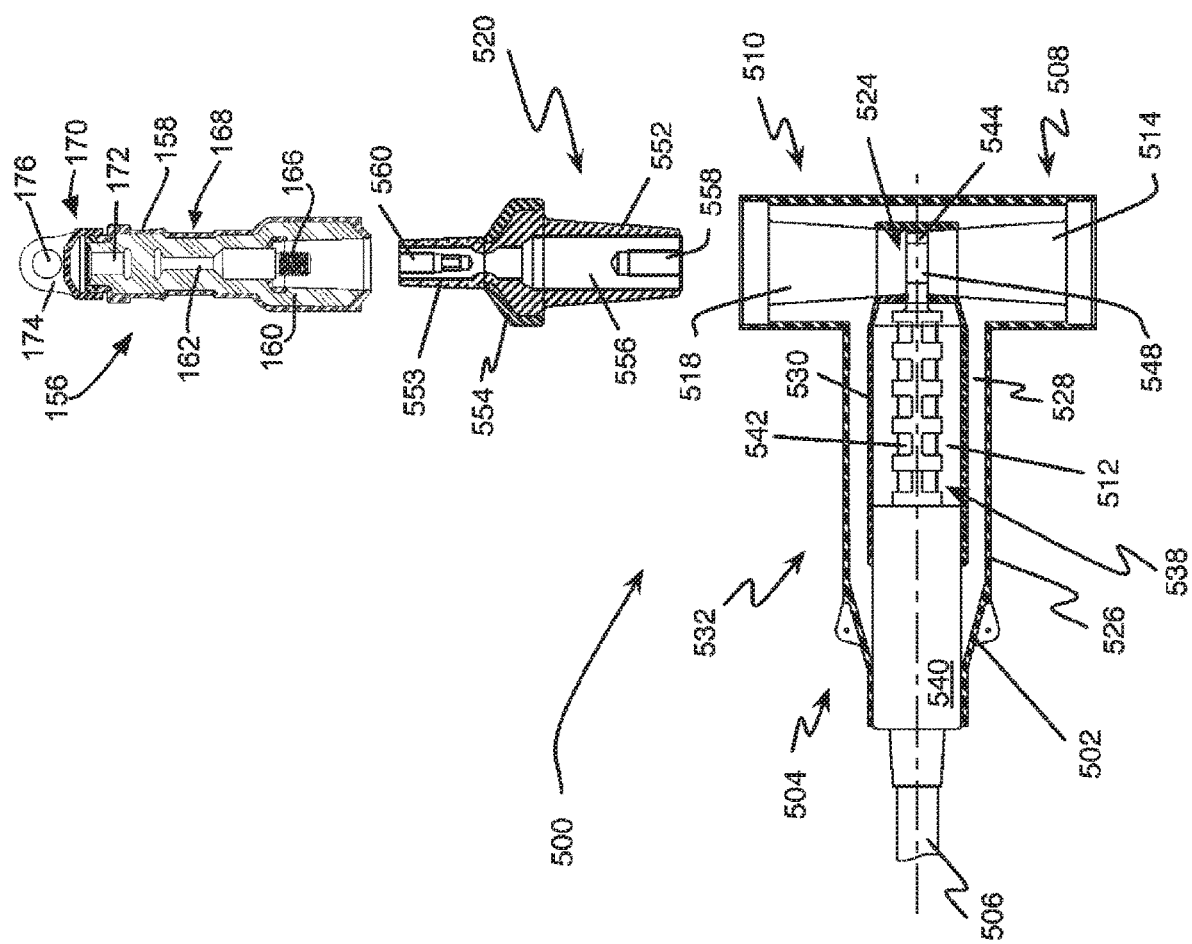
FIG. 5A is a schematic, exploded, cross-sectional diagram illustrating another power cable elbow connector consistent with implementations described herein.
Figure 5B:
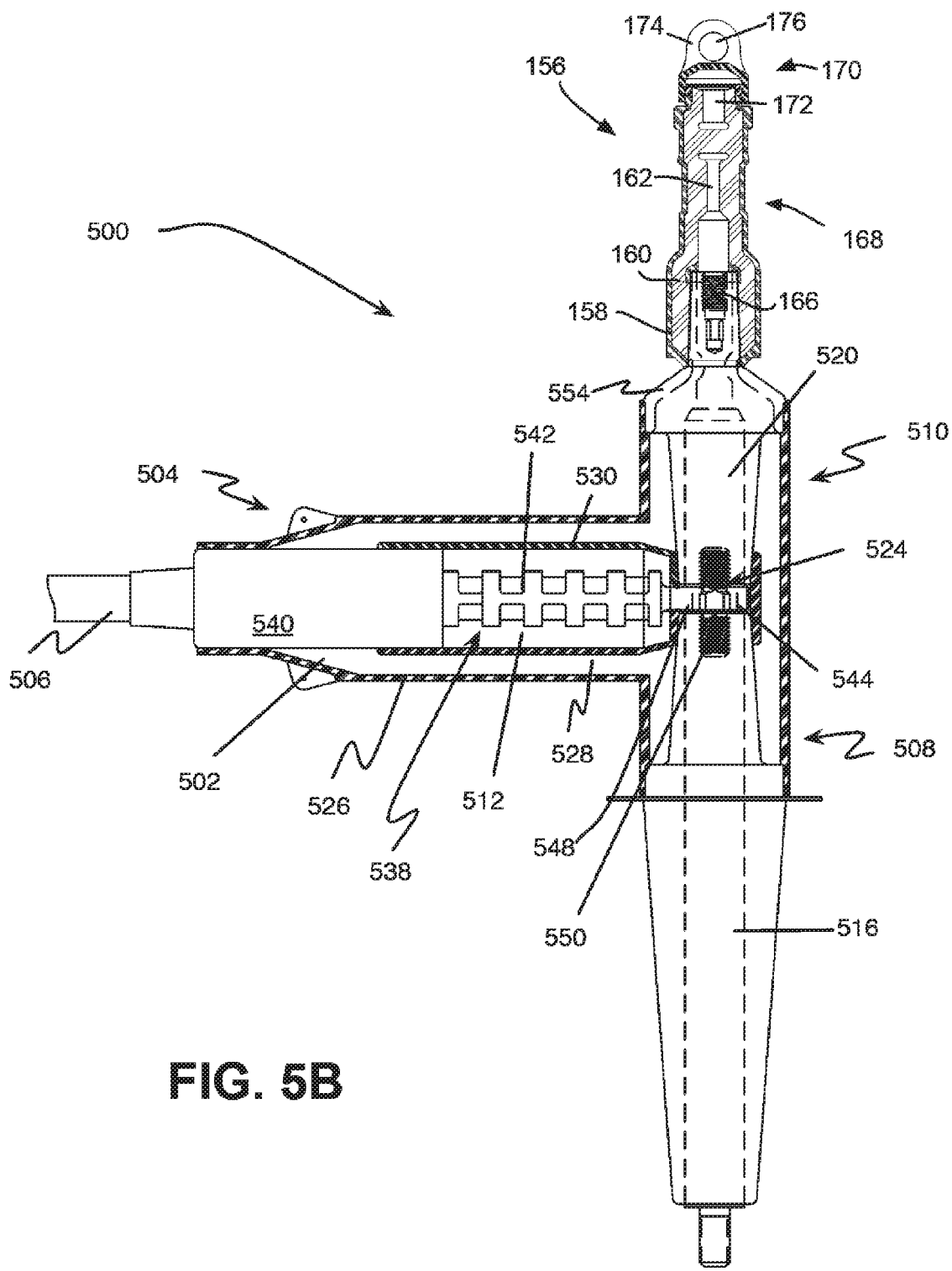
FIG. 5B is a cross-sectional diagram illustrating the power cable elbow connector of FIG. 5A in an assembled configuration.

FIG. 5A is a schematic, exploded, cross-sectional diagram illustrating a power cable elbow connector 500 consistent with implementations described herein. FIG. 5B is a cross-sectional diagram illustrating the power cable elbow connector 500 in an assembled configuration. As shown, the power cable elbow connector 500 can include a main housing body 502 that includes a conductor receiving end 504 for receiving a power cable 506 therein and first and second T-ends 508/610.

The conductor receiving end 504 can extend along a main axis of the connector 500 and can include a bore 512 extending therethrough. The first and second T-ends 508/610 can project substantially perpendicularly from the conductor receiving end 504 in Opposing directions from one another. For example the first T-end 508 is downwardly positioned and includes a bore 514 therein for receiving an equipment bushing, such as a deadbreak or loadbreak transforming bushing or other high or medium voltage terminal. The second T-end 510 is upwardly positioned and includes a bore 518 therein. As described in detail below, the bore 518 in the second T-end 510 is configured to receive a sacrificial adapter 520 and the sacrificial cap 156, described above. A contact area 524 can be formed at the confluence of the bores 512, 514, and 518.

The power cable elbow connector 500 can include an electrically conductive outer shield 526 formed from, for example, EPDM. Within the shield 526, the power cable elbow connector 500 can include an insulative inner housing 528, typically molded from an insulative rubber or epoxy material. Within the insulative inner housing 528, the power cable elbow connector 500 can include a conductive or semi-conductive insert 530 that surrounds the connection portion of power cable 506.

The conductor receiving end 504 of the power cable elbow connector 500 can be configured to receive a prepared end of the power cable 506 therein. For example, a forward end of power cable 506 can be prepared by the connecting power cable 506 to a conductor spade assembly 538. More specifically, the conductor spade assembly 538 can include a rearward sealing portion 540, a crimp connector portion 542, and a spade portion 544.

The rearward sealing portion 540 can include an insulative material surrounding a portion of the power cable 506 about an opening of the conductor receiving end 504. When the conductor spade assembly 544 is positioned within the connector body 502, the rearward sealing portion 540 can seal an opening of the conductor receiving end 504 about the power cable 506.

The crimp connector portion 542 can include a substantially cylindrical conductive assembly configured to receive a center conductor (not shown) of the power cable 506 therein. The crimp connector portion 542 can be crimped onto the center conductor prior to insertion of the cable 506 into the conductor receiving end 504.

The spade portion 544 can be conductively coupled to the crimp connector portion 542 and can extend axially therefrom within the bore 512. For example, in some implementations, the spade portion 544 can be formed integrally with the crimp connector portion 542 and be made of a conductive metal, such as, for example, steel, brass, aluminum, among others. As shown in FIG. 5A, the spade portion 544 can include a bore 548 extending perpendicularly therethrough. Upon insertion of the prepared cable 506 into the power cable elbow connector 500, the spade portion 544 can extend into the contact area 524, with the bore 548 aligned with the bores 514 and 518 in the first and second T-ends 508/610, respectively. Once the spade portion 544 is seated within the contact area 524, the bore 548 can allow a threaded stud 550 or other coupling element (e.g., a pin, rod, bolt, etc.) to conductively couple the spade portion 544 to the bushing 516 and the sacrificial adapter 520.

As briefly described above, the bore 518 in the second T-end 510 can be configured to receive the sacrificial adapter 520 therein. As shown in FIG. 5A, the sacrificial adapter 520 can include an insulative body portion 552 configured in a substantially conical or frustoconical shape for reception in the bore 518 of the second T-end 510. In addition, the body portion 552 can include a cap-engaging portion 553 projecting axially upwardly from a remainder of the body portion 552. The body portion 552 can be formed from rubber, plastic, or some other non-conductive material. In some implementations, the sacrificial adapter 520 can include a semi-conductive shoulder portion 554 formed over a portion of the body portion 552 that is exposed following insertion of the sacrificial adapter 520 into the bore 518 and placement of the sacrificial cap 156 on sacrificial adapter, as described below. The semi-conductive portion 554 can be formed of EPDM and can provide a continuous grounding surface for the power cable elbow connector 500 following assembly thereof.

As shown, the sacrificial adapter 520 also includes a conductive core portion 556 embedded within the body portion 552 and extending axially therein through the cap-engaging portion 553. The core portion 556 can be formed of any suitable conductive material, such as, for example, copper or aluminum, among other materials. The sacrificial adapter 520 can include a first threaded opening 558 for receiving the threaded stud 550 therein to create a conductive pathway between the power cable 506 and the sacrificial adapter 520, as shown in FIG. 5B.

During assembly, as shown in FIG. 5B, the threaded stud 550 is initially threaded into a threaded opening in the bushing 516 via bore 548 in the spade portion 544. The sacrificial adapter 520 is then inserted into the bore 518 in the second T-end 510 and rotated to secure the stud 550 into the first threaded opening 558 in the sacrificial adapter 520.

As shown in FIG. 5B, following attachment to the stud 550, the sacrificial adapter 520 can be seated within the second T-end 510 of the connector 500, such that only the semi-conductive portion 554 is exposed above the opening 518.

Returning to FIG. 5A, conductive the core portion 556 of the sacrificial adapter 520 also includes a second threaded opening 560 within the cap-engaging portion 553 for receiving the male protrusion 166 of the sacrificial cap 156.

When it is necessary for work to be performed on the power cable 506 (or devices connected to power cable 506), a worker can remove the test point cap 174, monitor voltage via the test point terminal 172, cut through the sacrificial cap 156 at the cut-through region 168 (e.g., with a grounded hydraulic cable cutter, or similar tool) to ensure that the electrical system that the connector 500 is connected to has been properly de-energized and is, therefore, safe to work on. When it is time to reenergize the connector 500, the cut-through sacrificial cap 156 can be removed and a new or replacement sacrificial cap 156 can be installed.

By providing an effective mechanism for establishing demonstrative evidence of a de-energized system/circuit in an electrical connector, various personnel can be more easily able to safely identify and confirm a de-energized condition in a switchgear assembly. More specifically, consistent with aspects described herein, personnel can be able to create and view a physical disconnect of a connected portion of the electrical system without damaging (and necessarily replacing) connected power cables or other components.

The foregoing description of exemplary implementations provides illustration and description, but is not intended to be exhaustive or to limit the embodiments described herein to the precise form disclosed. Modifications and variations are possible in light of the above teachings or can be acquired from practice of the embodiments. For example, implementations described herein can also be used in conjunction with other devices, such as high voltage switchgear equipment, including 15 kV, 25 kV, or 35 kV equipment.

For example, various features have been mainly described above with respect to electrical splicing connectors. In other implementations, other medium/high voltage power components can be configured to include the sacrificial appendage/adapter configurations described above.

While the invention has been described in connection with what is presently considered to be the most practical and preferred embodiment, it is to be understood that the invention is not to be limited to the disclosed embodiment(s), but on the contrary, is intended to cover various modifications and equivalent arrangements included within the spirit and scope of the appended claims, which scope is to be accorded the broadest interpretation so as to encompass all such modifications and equivalent structures as permitted under the law. Furthermore it should be understood that while the use of the word preferable, preferably, or preferred in the description above indicates that feature so described may be more desirable, it nonetheless may not be necessary and any embodiment lacking the same may be contemplated as within the scope of the invention, that scope being defined by the claims that follow. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

The invention claimed is:

1. A medium or high voltage electrical device comprising:
    a housing;
    a central conductor provided within the housing; and
    a sacrificial cap configured for mounting on the housing, wherein the sacrificial cap comprises:
        an outer housing;
        an insulated body; and
        a sacrificial conductor provided within the insulated body, wherein the sacrificial conductor electrically communicates with the central conductor within the housing when the sacrificial cap is mounted on the housing; and
    a voltage test point terminal provided within the insulated body and extends through an opening in, and accessible via, the outer housing of the sacrificial cap, the voltage test point terminal being capacitively coupled with the sacrificial conductor, the voltage test point terminal being separated from the sacrificial conductor by a portion of the insulated body,
    wherein the sacrificial cap includes a portion configured to be physically severed to confirm that the electrical device is de-energized.

2. The electrical device of claim 1, wherein at least a portion of the outer housing of the sacrificial cap includes a semi-conductive outer shield.

3. The electrical device of claim 2, wherein the at least a portion of the sacrificial cap comprises a ethylene-propylene-dienemonomer (EPDM) shield.

4. The electrical device of claim 1, further comprising a test point cap configured to be removably engaged with the outer housing of the sacrificial cap, the test point cap configured to engage with the outer housing at a position at which the test point cap extends over the opening in the outer housing.

5. The electrical device of claim 4, wherein the test point cap comprises a semi-conductive material,
    wherein the test point terminal includes a first enlarged portion adjacent to the portion of the insulated body separating the voltage test point terminal from the sacrificial conductor, the first enlarged portion having a size that is larger than an adjacent portion of the voltage test point terminal, and
    wherein the sacrificial conductor includes a second enlarged portion adjacent to the portion of the insulated body separating the voltage test point terminal from the sacrificial conductor, the second enlarged portion having a size that is larger than an adjacent portion of the sacrificial conductor.

6. The electrical device of claim 1, wherein the voltage test point terminal is spaced from the sacrificial conductor within the insulated body of the sacrificial cap.

7. The electrical device of claim 1, wherein the sacrificial cap comprises a cut-through portion that includes at least a portion of the sacrificial conductor.

8. The electrical device of claim 7, wherein the outer housing of the sacrificial cap comprises graphical indicia indicating a location of the cut-through portion.

9. The electrical device of claim 1, wherein the housing includes a direct access port therethough for accessing the central conductor, and wherein the sacrificial cap is mounted to the direct access port.

10. The electrical device of claim 9, wherein the sacrificial conductor further comprises a sacrificial probe conductor projecting from the insulated body,
    wherein the sacrificial probe conductor contacts the central conductor via the direct access port when the sacrificial cap is mounted to the direct access port.

11. The electrical device of claim 9, wherein the insulated body of the sacrificial cap includes an engagement portion for engaging the direct access port in the housing,
    wherein the engagement portion comprises a cylindrical or frustoconical cavity for receiving a projection portion of the direct access port,
    wherein the sacrificial probe conductor extends through the engagement portion.

12. The electrical device of claim 11, wherein the engagement portion comprises at least one resilient ring for engaging a corresponding groove in the projection portion of the direct access port.

13. The electrical device of claim 12, wherein the housing further comprises:
    a cable receiving end having a first bore extending therethrough for receiving a power cable having the central conductor;
    a first T-end projecting perpendicular to the cable receiving end and including a second bore extending therethrough that communicates with the first bore in the cable receiving end;
    a second T-end projecting perpendicular to the cable receiving end and including a third bore extending therethrough that communicates with the first bore in the cable receiving end and the second bore in the first T-end; and
    an adapter component configured for insertion into the second bore in the second T-end, wherein the adapter component includes an insulated outer body and a conductive core configured to conductively communicate with the central conductor of the power cable, and wherein the sacrificial conductor of the sacrificial cap electrically communicates with the conductive core of the adapter component when the sacrificial cap is mounted on the adapter component.

14. The electrical device of claim 13, wherein the second bore in the second T-end comprises a substantially conical configuration, and wherein at least a portion of the adapter component includes a conical outer surface for mating with the second bore.

15. A medium or high voltage electrical device comprising:
a housing having an adapter component configured for insertion into a bore in a T-end of the housing, the adapter component includes an insulated outer body and a conductive core configured to conductively communicate with a central conductor of a power cable,
a central conductor provided within the housing; and
a sacrificial cap configured for mounting on the housing, wherein the sacrificial cap comprises:
an outer housing;
an insulated body; and
a sacrificial conductor provided within the insulated body, wherein the sacrificial conductor electrically communicates with the central conductor within the housing when the sacrificial cap is mounted on the housing; and
a voltage test point terminal provided within the insulated body and accessible via, the outer housing of the sacrificial cap to capacitively couple with the sacrificial conductor,
wherein the sacrificial conductor of the sacrificial cap electrically communicates with the conductive core of the adapter component when the sacrificial cap is mounted on the adapter component,
wherein the sacrificial cap includes a portion configured to be physically severed to confirm that the electrical device is de-energized, and
wherein the adapter component includes a cap engaging portion for engaging the sacrificial cap.

16. The electrical device of claim 15, wherein the conductive core of the adapter component extends through the cap engaging portion,
wherein the conductive core in the cap engaging portion includes a first cavity therein,
wherein the sacrificial cap comprises a second cavity for receiving the cap engaging portion of the adapter component,
wherein a portion of the sacrificial conductor in the sacrificial cap projects within the second cavity, and
wherein the portion of the sacrificial conductor is received within the first cavity the conductive core in the cap engaging portion during placement of the sacrificial cap on the cap engaging portion of the adapter component.

17. A method, comprising:
providing an electrical device with a housing and a central conductor provided within the housing;
installing a sacrificial cap onto the electrical device so that a sacrificial conductor of the sacrificial cap electrically communicates with the central conductor of the electrical device, wherein the sacrificial cap includes a voltage test point terminal that capacitively couples with the sacrificial conductor;
monitoring a voltage at the voltage test point terminal in the sacrificial cap via engagement with a portion of the voltage test point terminal that extends through an opening in an external surface of the sacrificial cap;
when it is determined that the sacrificial cap is de-energized based on the monitoring, physically severing the sacrificial cap to confirm that the electrical device is de-energized;
performing service on equipment conductively coupled to the electrical device;
removing the sacrificial cap; and
installing a replacement sacrificial cap onto the electrical device.

18. The method of claim 17, wherein the electrical device comprises a yoke device having a sacrificial appending extending therefrom, wherein the sacrificial cap mounts to the sacrificial appendage.

19. The method of claim 17, wherein the sacrificial cap comprises an outer housing and an insulative inner housing, wherein the sacrificial conductor is provided within the insulative inner housing, and wherein physically severing the sacrificial cap further comprises:
severing an outer housing and the insulative inner housing in a region overlying the sacrificial conductor.

20. The method of claim 17, wherein the electrical device comprises a direct access port for accessing the central conductor via the housing, the method further comprising:
installing the sacrificial cap onto the direct access port,
wherein the sacrificial conductor further comprises a sacrificial probe conductor projecting from the insulated body, and
wherein the sacrificial probe conductor contacts the central conductor via the direct access port when the sacrificial cap is mounted to the direct access port.

* * * * *